United States Patent [19]
van der Poel et al.

[11] Patent Number: 5,574,743
[45] Date of Patent: Nov. 12, 1996

[54] SEMICONDUCTOR DIODE LASER HAVING IMPROVED PERFORMANCE AND METHOD OF MANUFACTURING SAME

[75] Inventors: Carolus J. van der Poel; Gerard A. Acket; Marcel F. C. Schemmann, all of Eindhoven, Netherlands

[73] Assignee: U.S. Philips Corporation, New York, N.Y.

[21] Appl. No.: 407,931

[22] Filed: Mar. 21, 1995

[30] Foreign Application Priority Data

Mar. 22, 1994 [EP] European Pat. Off. .............. 94200730

[51] Int. Cl.⁶ ..................................................... H01S 3/19
[52] U.S. Cl. ................................................ 372/46; 372/45
[58] Field of Search ......................................... 372/45, 46

[56] References Cited

U.S. PATENT DOCUMENTS 5,027,362 6/1991 Hokanson et al. ........................ 372/38

OTHER PUBLICATIONS

"Heterostructure Lasers, Part B: Materials and Operating Characteristics" by H. C. Casey and M. B. Panish, Academic Press 1978, Ch. 7.6, pp. 207–217. (no month).
"Effect of Cavity Length on Stripe–Geometry DH Laser Output" by R. T. Lynch, Jr., M. B. Small & R. Y. Hung, Appl. Phys. Lett 34(4), 15 Feb. 1979.

Primary Examiner—James W. Davie
Attorney, Agent, or Firm—Steven R. Biren

[57] ABSTRACT

Semiconductor diode lasers are used inter alia in optical disc systems, laser printers, bar code readers, and glass fibre communication systems. Lasers having a so-called (weakly) index-guided structure are very suitable for many applications inter alia because they can be manufactured comparatively simply and reliably. A disadvantage of the known (weakly) index-guided laser is that the so-called P-I (=optical power-current) characteristic thereof exhibits a kink. Such a kink limits the use of the laser to a relatively low optical power. According to the invention, such a (weakly) index-guided laser has a resonance cavity with a length for which the optical power at which a kink occurs in the P-I characteristic is a maximum. It was a surprise to find that the occurrence of a kink in the P-I curve of such a (weakly) index-guided laser depends on the length of the resonance cavity. Very surprising is the appearance of a maximum value in this kink power as a function of the length of the resonance cavity. Equally surprising is the occurrence of a series of such maxima, which are substantially equally high, and which are formed by the crests of a sawtooth curve with a very steep flank at the rising edge to each maximum. As a result, the laser length may be optimized not only in relation to the occurrence of kinks in the P-I characteristic but also in relation to other properties. The invention also relates to a method of manufacturing a laser according to the invention, which preferably includes a ridge waveguide structure.

13 Claims, 5 Drawing Sheets

SEMICONDUCTOR DIODE LASER HAVING IMPROVED PERFORMANCE AND METHOD OF MANUFACTURING SAME

BACKGROUND OF THE INVENTION

The invention relates to a semiconductor diode laser of the index-guided type, often referred to as laser for short hereinafter, comprising a semiconductor body with a semiconductor substrate of a first conductivity type on which a semiconductor layer structure is disposed which comprises at least in that order a first cladding layer of the first conductivity type, an active layer, and a second cladding layer of a second conductivity type opposed to the first, and comprising a pn junction which can generate coherent electromagnetic radiation, given a sufficient current strength in the forward direction, in a strip-shaped active region situated within a resonance cavity which is limited by surfaces extending substantially perpendicular to the active region, while the semiconductor layer structure is provided with means for forming a step in the effective refractive index on either side of the active region, and the first and the second cladding layer are provided with further means for forming an electrical connection. The invention also relates to a method of manufacturing such a laser.

Such a laser has various applications as a radiation source: optical disc systems, optical glass fibre communication systems, bar code readers, and laser printers. Lasers of the index-guided type are attractive especially because the emerging beam is diffraction-limited and the far field and wave front change comparatively little with the supplied optical power, and thus with the current through the laser, in sharp contrast to a laser of the gain-guided type. Lasers of a weakly index-guided type, in addition, are comparatively easy to manufacture. In many of the applications mentioned, furthermore, a laser is desired which can supply a maximum optical power, i.e. the highest possible yield of electromagnetic radiation.

Such a laser with a strip-shaped geometry is known from "Heterostructure Lasers, Part B: Materials and Operating Characteristics" by H. C. Casey and M. B. Panish, Academic Press 1978, Ch. 7.6, pp. 207–217. The diode presented therein, for example in FIGS. 7-6-5(a), comprises an n-GaAs substrate with an active layer of GaAs disposed thereon between an n-type and a p-type AlGaAs cladding layer. The electrical connection means comprise a metal layer at the substrate side and a p-GaAs contact layer and a further metal layer at the side of the upper cladding layer. The further means comprise the presence of a mesa above the active region which occupies a major portion of the second cladding layer, so that the laser is of the (weakly) index-guided type.

A disadvantage of the known laser is that it is not capable of supplying a very high useful power. The so-called P (=optical power) versus I (=electric current) characteristic does not show one substantially linear gradient above the threshold current —as is desirable—, but a kink is often found in practice in said P-I characteristic at a comparatively low optical power. At such a kink, the derivative of the optical power versus the current strength changes, and the emitted radiation beam is no longer diffraction-limited. It will be clear that such an effect limits the usefulness of the laser to optical powers below the optical power where such a kink occurs. The effect described above will be referred to hereinafter as kinking. The optical power at which such a kink is observed will be referred to as the kink power ($P_{kink}$).

SUMMARY OF THE INVENTION

The present invention has for its object inter alia to realize a semiconductor diode laser which does not have this disadvantage, or at least has it to a much lesser degree, and which has a substantially linear (kink-free) P-I characteristic above the threshold current up to a very high optical power. The invention also has for its object to provide a method of manufacturing such a laser.

According to the invention, a semiconductor diode laser of the kind mentioned in the opening paragraph is for this purpose characterized in that the resonance cavity has at least a length for which the optical power at which the derivative of the optical power as a function of the current through the pn junction changes is a maximum. It was surprisingly found that kinking in the P-I characteristic depends on the length of the resonance cavity of the laser. Furthermore, it was highly surprising to find that the kink power has a maximum value for a certain value of the length of the resonance cavity. The value of the length at which the kink power is a maximum may be determined for lasers manufactured on one and the same substrate by means of experiments in which a number of lasers with various resonance cavity lengths are manufactured while all other properties are the same. This maximum kink power is substantially greater (up to a factor two) than the kink power which is found on average, i.e. when an arbitrary length is taken for the resonance cavity. A laser according to the invention, therefore, is highly suitable for the applications mentioned above because it has a substantially linear P-I characteristic up to a very high optical power.

It is noted that "Effect of cavity lengths on stripe-geometry DH laser output linearity" by R. T. Lynch et al., Appl. Phys. Lett. 34 (4), 15 Feb. 1979, p. 297, reports that a shortening of the laser length resulted in a higher kink power. The results in the above article relate to lasers of the gain-guided type, which differs fundamentally from the index-guided type laser of the present invention. The effect observed is ascribed to a difference in gain between the lowest-order lateral waveguide modes, which decreases monotonically with laser length. Such an effect plays a negligible part in the index-guided lasers of the present invention since this effect will not become active until at very high optical powers. In the lasers of the cited article, moreover, no maximum in the kink power as a function of laser length will occur even then.

A first embodiment of a laser according to the invention is characterized in that the length of the resonance cavity forms part of a set of lengths which lie at substantially equal distances from one another, while for each of the lengths forming part of the set the optical power at which the derivative of the optical power as a function of the current through the pn junction changes is a maximum. It was a further surprise to find that the kink power has a number of further maxima, substantially of the same value, as a function of the resonance cavity length, which maxima corresponds to different lengths of the resonance cavity which lie at substantially equal distances from one another. The gradient of the kink power as a function of resonance cavity length has the shape of a (rounded) sawtooth with a substantially fixed amplitude and period. The position of a resonance cavity with a length which forms part of a set of lengths corresponding to one of the further maximum kink powers renders the laser according to the invention even more suitable for high power applications. Indeed, a maximum kink power may be combined with a great length in this manner. A great length promotes both a low starting current density and a low temperature-dependence of the starting current. As a result, such a laser combines a high power with a long life.

Preferably, the resonance cavity of a laser according to the invention has a length which lies between a first length for which the optical power at which the derivative of the optical power as a function of the current through the pn junction changes is a maximum, and a second length, greater than the first, for which this kink power has approximately 50% of its maximum value. In this region situated behind each maximum of the kink power, the laser has a kink power which is greater than the average kink powers over all possible lengths. This is related to the fact that each flank of the sawtooth curve lying before a (further) maximum is substantially perpendicular to the longitudinal axis. Even better lasers are obtained when the length of the resonance cavity lies between a first length for which the optical power at which the derivative of the optical power as a function of the current through the pn junction changes is a maximum, and a second length, greater than the first, for which this kink power is approximately 80% of its maximum value. The best possible results are found in practice when the resonance cavity length lies between a first length for which the optical power at which the derivative of the optical power as a function of the current through the pn junction changes is a maximum and a length which is approximately 20 µm greater. The inaccuracy of the cleaving process in which the resonance cavity is formed is approximately ±10 µm. When the length of the resonance cavity is on average approximately 10 µm greater than a length corresponding to a maximum kink power, the very steep collapse of the kink power at the area of such a maximum in the case of smaller lengths is adequately avoided.

Preferably, a length forming part of said set is equal to the smallest length for which the optical power at which the derivative of the optical power as a function of the current through the pn junction changes is a maximum, added to which is half the oscillation period between the fundamental and the first-order lateral modes of the electromagnetic radiation generated in the active region multiplied by an integer. The oscillation period may be estimated through calculation when the dimensions of the active region and the values of the refractive indices around the active region are known. It is found in practice that the period of the sawtooth mentioned above corresponds fairly closely to once half the oscillation period. By adding this half oscillation period an integer number of times to the length for which the first maximum in the kink power is observed, one obtains a fair estimate of the lengths for which the kink power will show further maxima. The exact length for which a further maximum occurs may be found in a simpler manner through experimenting with various resonance cavity lengths close to such an estimated length.

The oscillation period p may be estimated through calculation because it is equal to $2\pi/(\beta_0-\beta_1)$ and to $\lambda/2*\Delta n_{01}$, in which $\beta_0$ and $\beta_1$ are the propagation constants of the fundamental and the first-order lateral modes, respectively, of the electromagnetic radiation generated in the active region, $\lambda$ is the wavelength of the electromagnetic radiation generated in the active region, and $\Delta n_{01}$ is the difference in effective refractive index for the fundamental and the first-order lateral modes of the electromagnetic radiation generated in the active region.

This is based on the following surprising recognition: the first-order lateral mode in an index-guided laser has a wavelength $\lambda_1$ which is greater than the wavelength $\lambda_0$ of the fundamental lateral mode because the former mode is faced with a lower effective refractive index than the latter mode. It is assumed that a phase-locked first-order lateral mode propagates in the laser which is operated above the kink power. This implies that both the fundamental and the first-order lateral mode form a standing wave in the resonance cavity of the laser. An oscillation then arises between the fundamental and the first-order lateral mode inside the resonance cavity, which corresponds to the occurrence of the kink in the L-I characteristic. It holds for the oscillation period $L_b$ that:

(1) $L_b = k*\lambda_1 = (k+1)*\lambda_0$, $\{k \in N^+\}$.

From which it follows that:

(2) $L_b = \lambda_0*\lambda_1/(\lambda_1-\lambda_0) = 1/(1/\lambda_0-1/\lambda_1)$, or:

(3) $1/L_b = 1/\lambda_0 - 1/\lambda_1$.

The phase condition for a standing wave in the resonance cavity with L implies that:

(4) $L = m*\lambda/2$.

If the condition holds both for the fundamental and the first-order mode, it follows that:

(5) $L = m_0*\lambda_0/2$ and (6) $L = m_1*\lambda_1/2$, $\{(m_0,m_1) \in N^+ \cap m_0 < m_1\}$.

It follows from (5) and (6) that:

(7) $1/\lambda_0 = m_0/2*L$ and (8) $1/\lambda_1 = m_1/2*L$.

Substitution of (7) and (8) in (3) yields:

(9) $1/L_b = (m_1-m_0)/2*L = m_3/2*L$, $\{m_3 \in N^+\}$.

Rewriting of (9) results in:

(10) $L = m_3*L_b/2$, $\{m_3 \in N^+\}$.

Preferably, the laser according to the invention has a structure which is weakly index-guided and whose V parameter lies between approximately $\pi/2$ and approximately $\pi$, in which $V = (2*\pi*w/\lambda)*\sqrt{(n_2^2-n_1^2)}$, in which w is the width of the active region, $\lambda$ the wavelength of the laser emission, $n_2$ the effective refractive index at the area of the active region, and $n_1$ the effective refractive index on either side of the active region. These lasers as such are already comparatively easy to manufacture, but they are also very suitable for the emission wavelength range below approximately 1 µm. In fact, lasers of the buried hetero type, which in themselves are highly desirable, are very difficult to manufacture in said wavelength range, or cannot be reliably manufactured. This is connected with the fact that these lasers often comprise layers which contain aluminium. The domain of the V parameter implies that not only the fundamental mode but also the first-order lateral mode occurs in such a laser for a usual width W of the active region (approximately 1 to approximately 7 µm). A usual value for the difference $n_2-n_1$ is approximately 1 to approximately $15*10^{-3}$.

A very attractive modification of a laser according to the invention has a ridge waveguide structure. Preferably, this is of the buried type and the layer by which the ridge is buried has such a bandgap that substantially no absorption of the generated radiation takes place. Such a laser has particularly low losses.

Preferably, the surfaces bounding the resonance cavity are provided with a coating. This considerably increases the maximum kink power, so that the laser can be used up to a considerably increased optical power.

The use of a semiconductor diode laser according to the invention in the pulsed mode also leads to a (considerable) rise in the maximum kink power.

A method of manufacturing a semiconductor diode laser of the index-guided type, whereby a semiconductor body is formed through the provision on a semiconductor substrate of a first conductivity type of a semiconductor layer structure which comprises at least in that order a first cladding layer of the first conductivity type, an active layer, and a second cladding layer of a second conductivity type opposed to the first, and in which a pn junction, a strip-shaped active region, and a surrounding resonance cavity bounded by surfaces which are substantially perpendicular to the active region are formed, the semiconductor layer structure being provided with means for forming a step in the effective refractive index on either side of the active region, while the first and second cladding layers are provided with further means for forming an electrical connection, is characterized according to the invention in that for the resonance cavity at least a length is chosen for which the optical power at which the derivative of the optical power as a function of the current through the pn junction changes is a maximum. Such a method yields lasers according to the invention which have a particularly high kink power and which are accordingly highly suitable for many applications.

BRIEF DESCRIPTION OF THE DRAWING

The invention will now be explained in more detail with reference to several embodiments and the accompanying drawing, in which.

Figure 1:
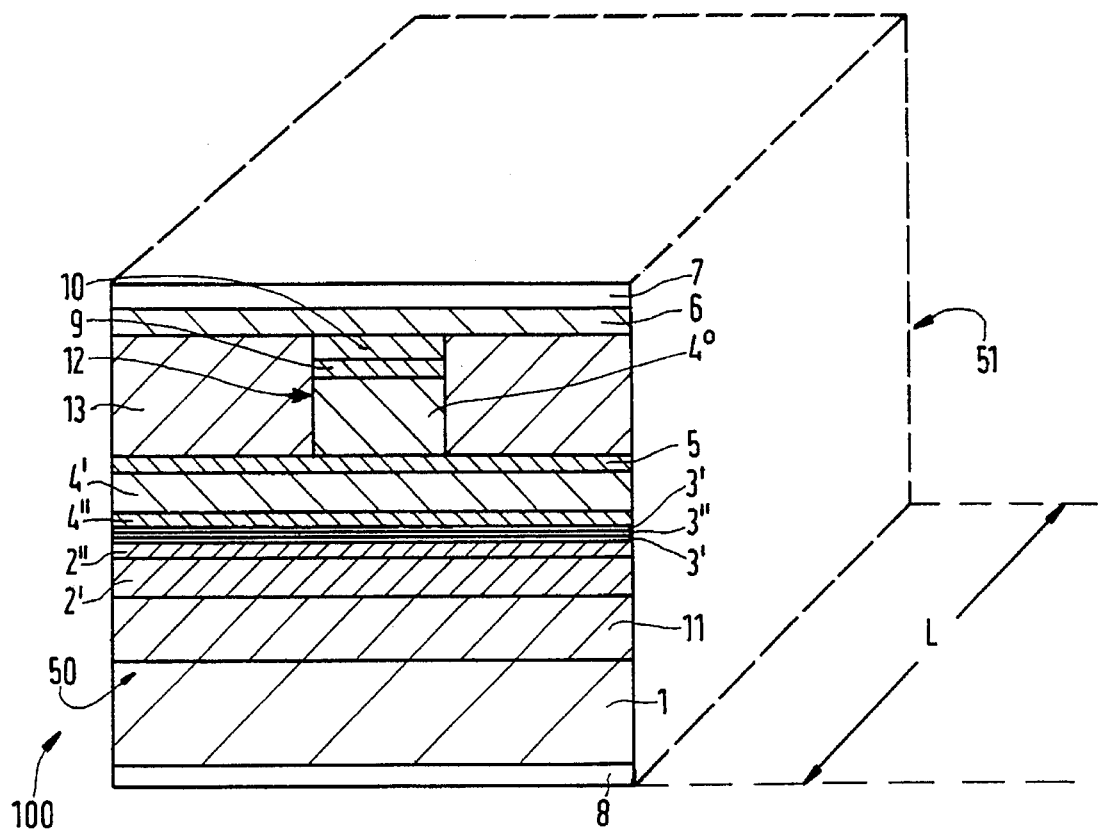
FIG. 1 diagrammatically and in perspective view shows a semiconductor diode laser according to the invention in a first embodiment.

The Figures are diagrammatic and not drawn to scale, the dimensions in the thickness direction being particularly exaggerated for greater clarity. Corresponding parts are usually given the same reference numerals in the various examples. Semiconductor regions of the same conductivity type are generally hatched in the same direction.

DESCRIPTION OF THE PREFERRED EMBODIMENTS

FIG. 1 is a diagrammatic perspective view of a first preferred embodiment of a semiconductor diode laser according to the invention. The laser 100 comprises a semiconductor body with a substrate 1 of a first, here the n-conductivity type and consisting of monocrystalline gallium arsenide in this example and, provided with a connection conductor 8. A semiconductor layer structure is provided on this body, comprising inter alia a buffer layer 11 of the n-conductivity type, a first cladding layer 2' also of the n-conductivity type, a first separate cladding layer 2", an active layer 3 which here comprises two quantum well layers 3' mutually separated by a barrier layer. 3", a second separate cladding layer 4", and a second cladding layer 4', 4°, here of the p-conductivity type, within which an etching stopper layer 5 is present. Plot only the portion 4° of the second cladding layer 4', 4° but also an intermediate layer 9 and a first contact layer 10, both also of the p-conductivity type, are present within a mesa-shaped portion 12 of the semiconductor layer structure. An n-type current blocking layer 13 is present on either side of the mesa 12. The means whereby a step is formed in the effective refractive index in lateral direction in the laser 100 of this example comprise the mesa 12 and the comparatively thin portion 4' of the second cladding layer 4', 4° situated under this mesa. The laser 100 thus is of the index-guided type, more precisely of the weakly index-guided type, and has a so-called ridge waveguide structure. The further means for forming an electrical connection of the cladding layers 2, 4 here comprise, in addition to said substrate 1 provided with a connection conductor 8, the first contact layer 10, a second contact layer 6, which is also of the p-conductivity type and extends above the mesa 12 and the blocking layer 13, and a connection conductor 7 provided thereon. The pn junction formed between the two cladding layers 2, 4 is capable of generating coherent electromagnetic radiation in a strip-shaped active region of the active layer 3 lying below the mesa 12 and inside a resonance cavity formed by surfaces 50, 51 which extend substantially perpendicularly to the active region, given a sufficiently strong current in the forward direction.

Thicknesses, materials, and other properties of the (semiconductor) layers of the laser 100 according to the example given above are listed in the Table below.

| No. | Semiconductor | Type | Doping concentr. (at/cm³) | Thickness (μm) |
|---|---|---|---|---|
| 1 | GaAs (Substrate) | N | $2 \times 10^{18}$ | 350 |
| 11 | $Al_{0.2}Ga_{0.8}As$ | N | $2 \times 10^{18}$ | 0,1 |
| 2' | $In_{0.5}Al_{0.35}Ga_{0.15}P$ | N | $2 \times 10^{18}$ | 1,3 |
| 2" | $In_{0.5}Al_{0.2}Ga_{0.3}P$ | N | $2 \times 10^{18}$ | 0,045 |
| 3' | $In_{0.62}Ga_{0.38}P$ | — | — | 0,0085 |
| 3" | $In_{0.5}Al_{0.2}Ga_{0.3}P$ | — | — | 0,006 |
| 4" | $In_{0.5}Al_{0.2}Ga_{0.3}P$ | P | $4 \times 10^{17}$ | 0,045 |
| 4' | $In_{0.5}Al_{0.35}Ga_{0.15}P$ | P | $4 \times 10^{17}$ | 0,5 |
| 4° | $In_{0.5}Al_{0.35}Ga_{0.15}P$ | P | $4 \times 10^{17}$ | 0,8 |
| 5 | $In_{0.4}Ga_{0.6}P$ | P | $1 \times 10^{18}$ | 0,01 |
| 6 | GaAs | P | $2 \times 10^{18}$ | 0,5 |
| 9 | $In_{0.5}Ga_{0.5}P$ | P | $1 \times 10^{18}$ | 0,1 |
| 10 | GaAs | P | $2 \times 10^{18}$ | 0,5 |
| 13 | GaAs | N | $2 \times 10^{18}$ | 1,4 |

The data given above mean that the laser 100 in this example is of the (weakly) index-guided type and has a so-called ridge waveguide structure. The blocking layer 13 here comprises a (radiation) absorbing material. The width of the mesa-shaped strip 12 is approximately 4.2 μm. The conductive layer 8 on the substrate 1 in this example is a gold-germanium-nickel layer with a thickness of approximately 1000 Å. The conductive layer 7 in this example comprises a platinum layer, a tantalum layer, and a gold layer with thicknesses of approximately 1000, approximately 500, and approximately 2500 Å, respectively.

According to the invention, the laser 100 of this example has a strip-shaped active region with a length $L_1$ of approximately 450 μm, for which the power at which the derivative of the optical power (P) as a function of the current (I) through the pn junction changes has approximately its maximum value. This means that the so-called P-I characteristic does not show a kink until at a very high optical power, i.e. a substantially maximum optical power for the laser 100, so that the laser according to the invention is particularly suitable for many applications in which a linear P-I characteristic is desired up to a very high optical power.

Figure 2:
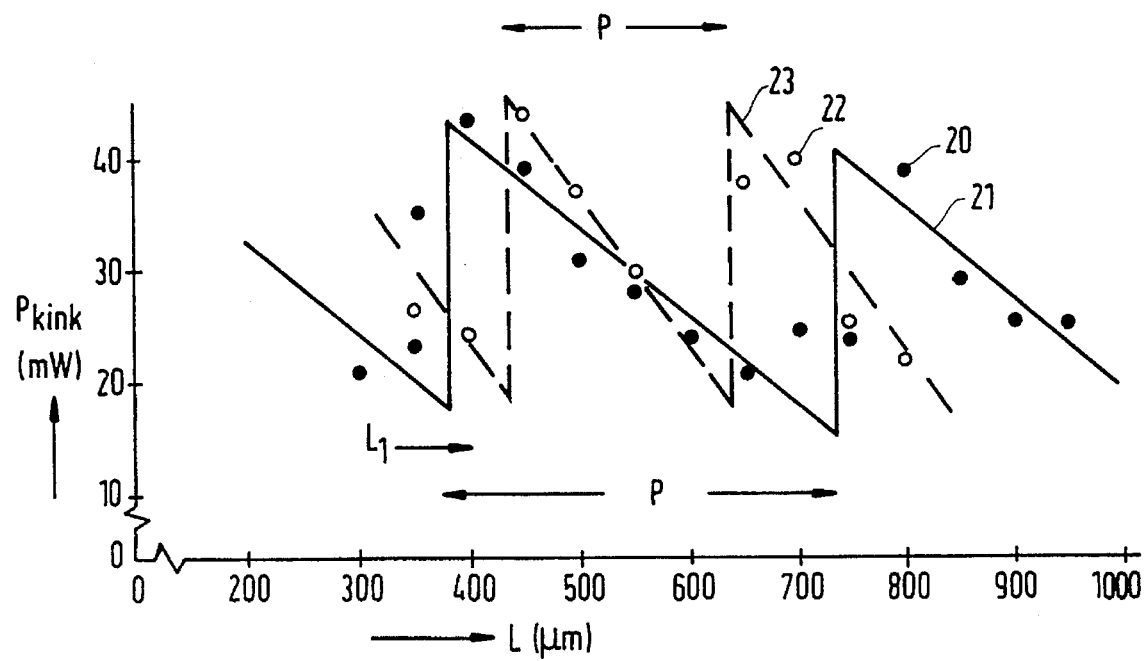
FIG. 2 shows the kink power ($P_{kink}$) of the laser of FIG. 1 as a function of the length (L) of the resonance cavity of the laser, in which the active layer comprises one (curve 21) or two (curve 23) quantum well layer(s)

FIG. 2 shows the kink power ($P_{kink}$) of the laser 100 of FIG. 1 as a function of the length (L) of the resonance cavity of the laser 100 (curve 23). The corresponding curve for a laser 100 in which the active layer comprises only one quantum well layer 3' is also shown (curve 21). Both curves 21, 23 show that the kink power $P_{kink}$ is a function of the length L and that a maximum occurs in the relevant curves. The symbols 20, 22 correspond to measurements carried out on actual lasers 100 on which the curves 21, 23 were based. The kink power $P_{kink}$ has a maximum for a length $L_1$ (curve 23) of approximately 440 μm in the laser 100 of this example, i.e. approximately 45 mW. FIG. 2 also shows that there is another maximum in the kink power $P_{kink}$ for a second length of the resonance cavity of approximately 640 μm which is approximately as high as the maximum for 440 μm. The laser 100 preferably has a length which lies between the length belonging to a maximum, here approximately 440 μm, and a second length greater than the first one, here approximately 540 μm, for which the kink power $P_{kink}$ has approximately 50% of its maximum value. The laser 100 according to the invention thus has a higher kink power $P_{kink}$ than if the length L of the resonance cavity of the laser 100 were chosen arbitrarily. A still better laser 100 is obtained when the second length L corresponds to the length for which the kink power has approximately 80% of its maximum value, here a length of approximately 435 μm. In practice, the laser 100 of this example preferably has a length lying between 440 μm and a length 20 μm greater, so 460 μm in this case. Such a laser 100 has substantially a maximum kink power and can also still be manufactured with a good yield because the inaccuracy in longitudinal direction during the formation of the mirror surfaces 50, 51 through cleaving of the semiconductor body amounts to approximately ±10 μm. The asymmetry in steepness of the curve 23 near a maximum is thus taken into account. The period p of the sawtooth curve 21 is approximately 400 μm, the estimated value of the oscillation period is approximately 500 μm. These values are approximately 200 μm and 40 μm, respectively, for the curve 23.

Figure 3:
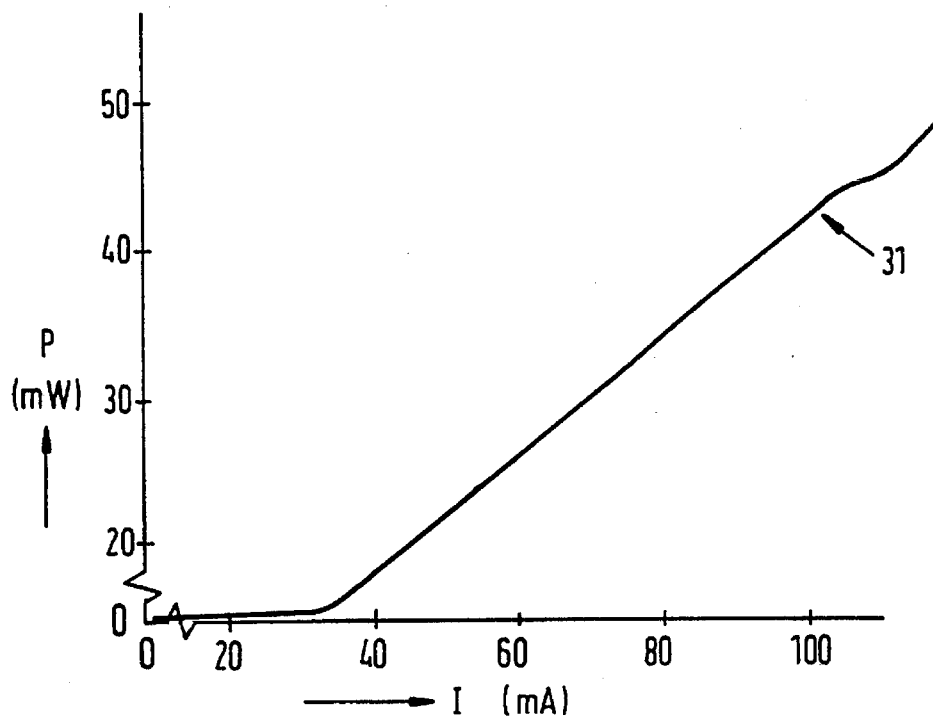
FIG. 3 shows the optical power (P) of the laser of FIG. 1 with two quantum well layers and with a resonance cavity having length $L_1$ as in FIG. 2 as a function of the current (I) through the laser.

FIG. 3 shows the optical power (P) of the laser of FIG. 1 with two quantum well layers and with a resonance cavity with length $L_1$ as in FIG. 2 as a function of the current (I) through the laser. FIG. 3 confirms that the laser 100 according to this embodiment of the invention has a substantially linear P-I characteristic over a wide range—i.e. up to point 31—, which is highly desirable. The laser 100 in this example has a starting current of approximately 35 mA, emits at a wavelength of approximately 675 nm, and is highly suitable for use in a bar code reader or laser printer.

The laser 100 in this example is manufactured as follows according to the invention. Manufacture starts with a (001) substrate 1 of monocrystalline n-type gallium arsenide with a doping concentration of $2 \times 10^{18}$ atoms per $cm^3$ and a thickness of, for example 350 μm. After polishing and etching of the surface having the (001) orientation, the following are grown thereon consecutively, for example, from the gas phase by OMVPE (=Organo Metallic Vapour Phase Epitaxy): a buffer layer 11, a first cladding layer 2', a first separate cladding layer 2", an active layer 3 comprising a first quantum well layer 3', a barrier layer 3" and a second quantum well layer 3', a second separate cladding layer 4", a first portion 4' of a second cladding layer 4', 4°, an etching stopper layer 5, a second portion 4° of the second cladding layer 4', 4°, an intermediate layer 9, and a first contact layer 10, which deposition takes place at a temperature of approximately 760° C. After removal of the structure from the growing device, a masking layer of silicon dioxide is provided thereon by sputtering and photolithography, which masking layer has the shape of a strip whose longitudinal axis is perpendicular to the plane of drawing of FIG. 1. A mesa-shaped strip 12, perpendicular to the plane of the drawing, is then etched into the semiconductor layer structure, conventional (selective) etching means being used for the layers situated above the etching stopper layer 5. After the structure has been cleaned, the blocking layer 13 is deposited on either side of the mesa 12, again by OMVPE. After removal of the silicon dioxide mask and cleaning of the structure, a second contact layer 6 is provided in a final OMVPE growing process. Materials, compositions, thicknesses, conductivity types, and doping concentrations are chosen for the semiconductor layers as indicated in the Table given above. Then a conductive layer 8, for example consisting of a gold-germanium-nickel layer of approximately 1000 Å thickness, is then provided on the substrate 1 by means of, for example, sputtering, and a conductive layer 7 is provided over the upper side of the structure, for example by the same technique, comprising a platinum layer, a tantalum layer, and a gold layer whose thicknesses are approximately 1000, approximately 500 and approximately 2500 Å, respectively. After cleaving to the desired length L, 450 μm in this case, the individual lasers are available for final mounting.

A length is chosen for the resonance cavity in the method according to the invention, in this example during cleaving, such that the optical power at which the derivative of the optical power as a function of the current through the laser changes is a maximum. A laser according to the invention is obtained in a simple manner by such a method.

Figure 4:
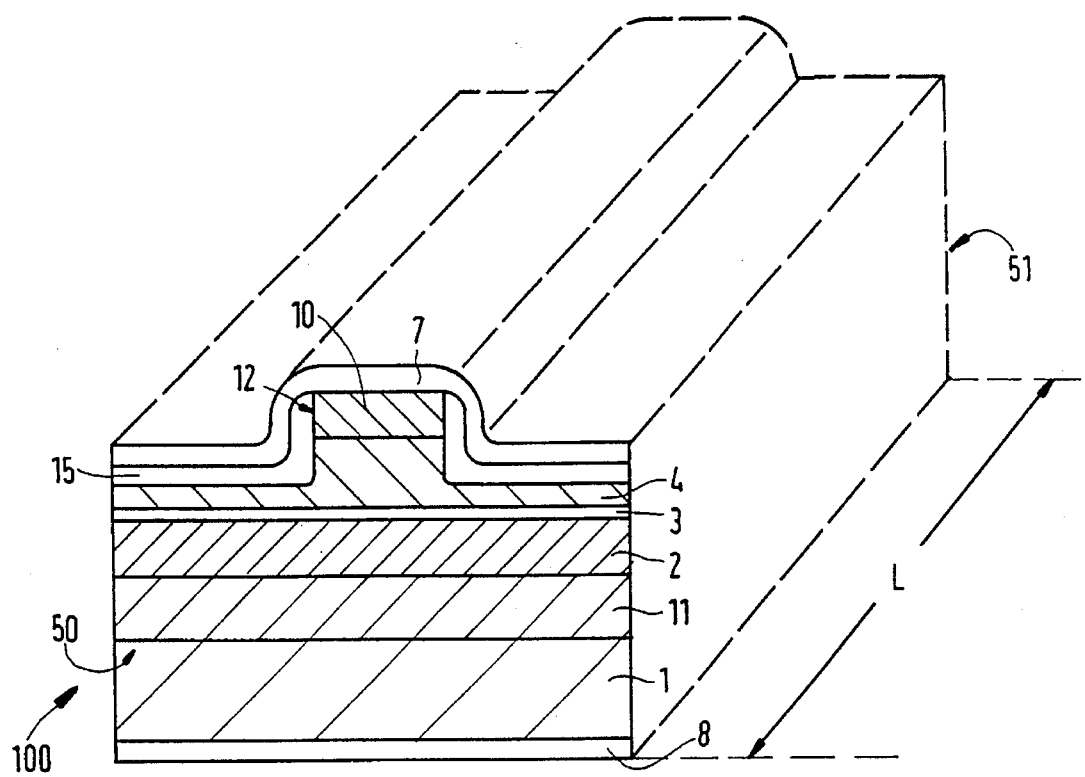
FIG. 4 is a diagrammatic perspective view of a second preferred embodiment of a semiconductor diode laser according to the invention.

FIG. 4 is a diagrammatic perspective view of a semiconductor diode laser 100 according to the invention and in a second preferred embodiment. The laser 100 has a similar construction to that of the laser of the first example, but here the semiconductor layers 6, 9 and 13 are absent. Instead of the blocking layer 13, an insulating layer 15, here obtained by anodic oxidation, is present on either side of and against the flanks of the mesa 12. The connection conductor 7 makes contact with the first contact layer 10 on top of the mesa 12. In addition, the active layer 3 here comprises a so-called bulk layer, and the laser 100 again has a weakly index-guided structure, but is not of the buried type. No absorption of the radiation emitted by the laser 100, which here has a wavelength of approximately 785 nm, takes place on either side of the mesa 12. The thickness of the second cladding layer 4 on either side of the mesa 12 is 0.29 μm. The width of the mesa-shaped strip 12 is approximately 3.6 μm. The connection conductors 7, 8 are the same as those in the previous example. The mirror surfaces 50, 51 of the laser 100 are coated with a highly reflecting and a weakly reflecting coating, respectively (not shown in the Figure). Thicknesses, materials, and other properties of the (semiconductor) layers of this embodiment of the laser 100 as described above are listed in the Table below.

| No. | Semiconductor | Type | Doping concentr. (at/cm³) | Thickness (µm) |
|---|---|---|---|---|
| 1 | GaAs | N | 2 × 10¹⁸ | 150 |
| 11 | GaAs | N | 2 × 10¹⁸ | 1 |
| 2 | Al₀.₅Ga₀.₅As | N | 2 × 10¹⁸ | 1,7 |
| 3 | Al₀.₁₃Ga₀.₈₇As | — | — | 0,04 |
| 4 | Al₀.₅Ga₀.₅As | P | 5 × 10¹⁷ | 1,7 |
| 10 | GaAs | P | 5 × 10¹⁸ | 0,5 |

The laser 100 of this embodiment of the invention comprises a strip-shaped active region with a length $L_2$, here a length of approximately 400 µm, for which the power at which the derivative of the optical power (P) as a function of the current (I) through the pn junction changes is a maximum. This means that the so-called P-I characteristic does not show a kink until at a very high optical power, i.e. a substantially maximum optical power for the laser 100, in this case approximately 55 mW, which renders the laser according to the invention particularly suitable for many applications in which a linear P-I characteristic is desired up to a very high optical power.

Figure 5:
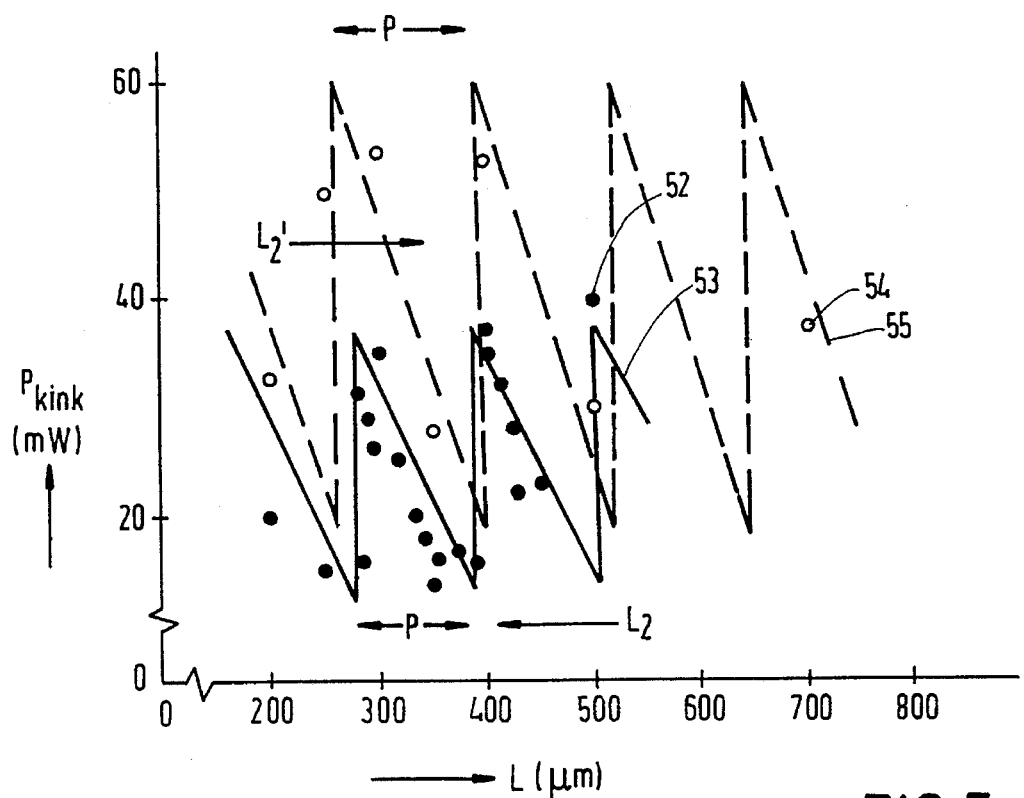
FIG. 5 shows the kink power ($P_{kink}$) of the laser of FIG. 4 as a function of the length (L) of the resonance cavity of the laser, the mirror surfaces of the laser being uncoated (curve 53) and coated with a covering layer (curve 55)

FIG. 5 shows the kink power ($P_{kink}$) of the laser 100 of FIG. 4 as a function of the length (L) of the resonance cavity, the mirror surfaces 50, 51 being uncoated (curve 53) or coated with a coveting layer (curve 55). A sawtooth gradient of the kink power $P_{kink}$ is observed also for the laser 100 in this example. The crests form a range of maximum kink powers for different lengths of the resonance cavity. The symbols 52, 54 correspond to measurements carried out on actual lasers 100 on which the curves 53, 55 were based. The laser 100 in this example (curve 55) has a length $L_2$ of 400 µm. The kink power $P_{kink}$ approximately has a maximum for this length, i.e. approximately 55 mW, in the laser 100 of this example. FIG. 5 also shows (curve 53) that the laser 100 of this example, when the mirror surfaces are not coated with a covering layer, also exhibits a sawtooth gradient of the kink power with substantially the same period p. In this case, however, the amplitude and especially all the value of the maximum kink power $P_{kink}$ are much lower then. For the remaining aspects of a discussion of FIG. 5, reference is made to the discussion of FIG. 2. The period p found for the curves 53, 55 is approximately 110 µm, the estimated value is approximately 130 µm.

Figure 6:
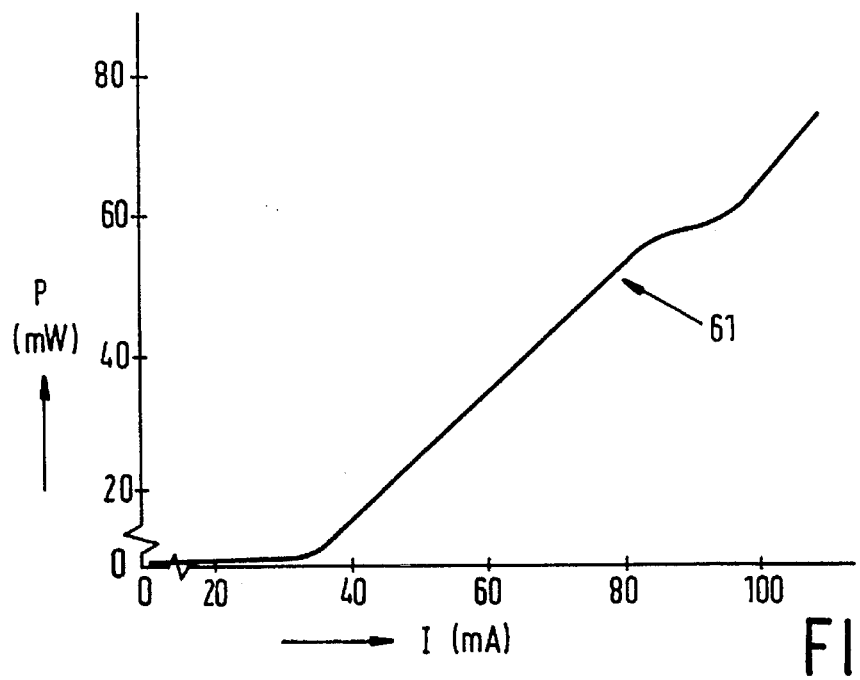
FIG. 6 shows the optical power (P) of the laser of FIG. 4 with coated mirror surfaces and a length $L_2$ as in FIG. 5 as a function of the current (I) through the laser.

FIG. 6 shows the optical power (P) of the laser of FIG. 4 with coated mirror surfaces and with a resonance cavity with length $L_2$ as in FIG. 2 as a function of the current (I) through the laser. FIG. 6 confirms that the laser 100 according to this embodiment of the invention has a substantially linear P-I characteristic over a wide range, i.e. up to point 61, which is highly desirable. The laser 100 according to this example has a starting current of approximately 35 mA, emits at a wavelength of approximately 785 nm, and is highly suitable for use as a read or write laser in a system for optical registration.

Figure 7:
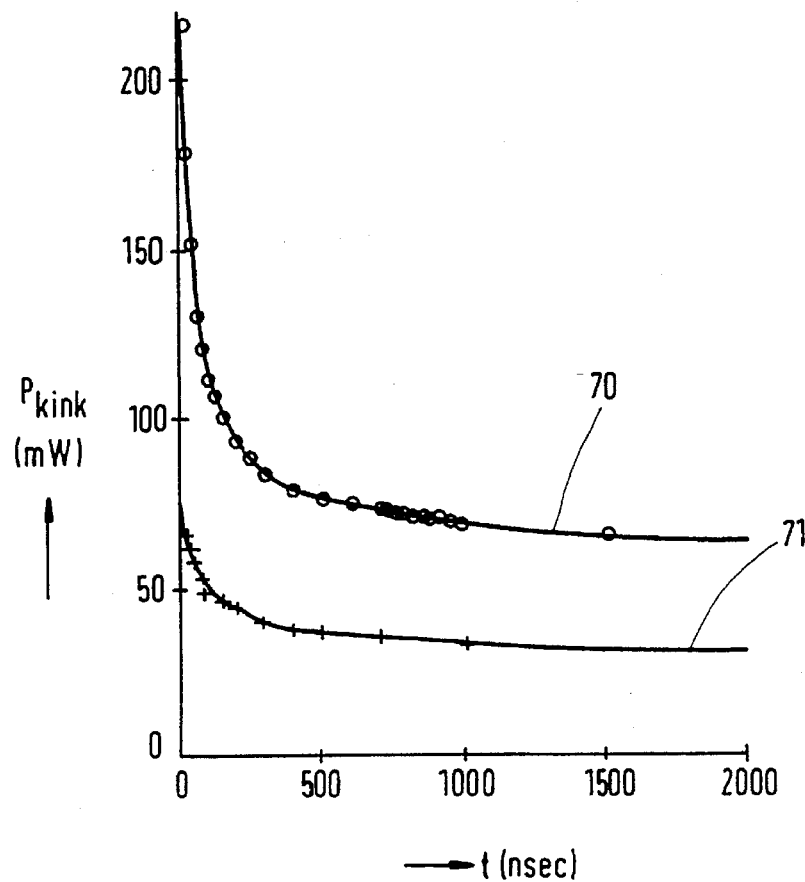
FIG. 7 shows the kink power ($P_{kink}$) of the laser of FIG. 4 with coated mirror surfaces as a function of the pulse width (t) during pulsed mode operation with a resonance cavity with length $L_2$ as in FIG. 5 (curve 70) and with a resonance cavity with length $L_2'$ as in FIG. 5.

FIG. 7 shows the kink power ($P_{kink}$) of the laser of FIG. 4 with coated mirror surfaces as a function of the pulse width (t) during operation in the pulsed mode with a resonance cavity having a length $L_2$ as in FIG. 5 (curve 70) and with a resonance cavity having a length $L_2'$ as in FIG. 5 (curve 71). The use of the pulsed mode results in a major improvement in the kink power $P_{kink}$ of a laser according to the invention, especially for pulse widths smaller than approximately 200 nsec. In fact, the kink power rises from approximately 60 mW to more than 200 mW (more than three times as much) for a resonance cavity with a length $L_2$ of approximately 400 µm, whereas for a non-optimum length $L_2'$ of approximately 350 µm this power increases from approximately 35 to approximately 75 mW (so only a doubling). A laser 100 according to the invention, therefore, is particularly attractive for use in the pulsed mode. It is noted that the optimum length for use in the pulsed mode is slightly greater (approximately 20 µm) than in the CW (=Continuous Working) mode. This is connected with the fact that the laser temperature in the former case is lower than in the latter case, where more heat is released.

The laser 100 according to this example is manufactured in a manner analogous to the manufacture of the laser of the first example of the invention. After the layers 11, 2, 3, 4 and 10 have been provided on a substrate 1, the mesa 12 is formed by etching. Before the removal of the mask used for this, an insulating layer 15 is provided on either side of and against the flanks of the mesa 12, in this case by means of anodic oxidation. After removal of this mask, the connection conductors 7, 8 are provided and the laser 100 is formed by cleaving. A coating present on the mirrors 50, 51 is provided by sputtering or vapour deposition.

Figure 8:
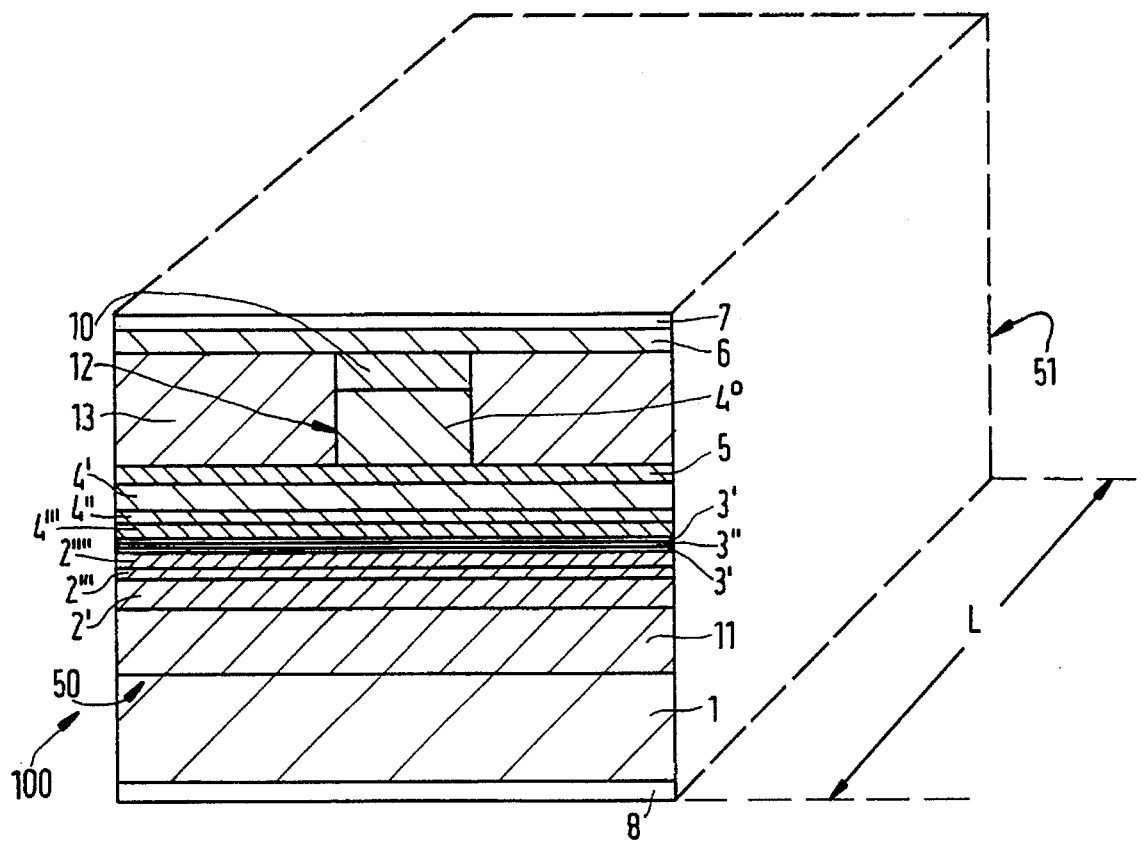
FIG. 8 is a diagrammatic perspective view of a third preferred embodiment of a semiconductor diode laser according to the invention.

FIG. 8 is a diagrammatic perspective view of a semiconductor diode laser according to a third embodiment of the invention. The laser 100 has a construction similar to that of the laser in the first example, but now the intermediate layer 9 is absent and the semiconductor layers (partly) comprise different materials or compositions. The laser 100 in this example emits at approximately 980 nm. The width of the mesa-shaped strip 12 is approximately 3 µm. The connection conductors 7, 8 are the same as in the previous example. Thicknesses, materials, and other properties of the (semiconductor) layers mentioned above for the laser 100 in this example are listed in the Table below.

| No. | Semiconductor | Type | Doping concentr. (at/cm³) | Thickness (µm) |
|---|---|---|---|---|
| 1 | GaAs (Substrate) | N | 2 × 10¹⁸ | 350 |
| 2' | Al₀.₄Ga₀.₆As | N | 2 × 10¹⁸ | 1,3 |
| 2" | Al₀.₂Ga₀.₈As | N | 2 × 10¹⁸ | 0,04 |
| 2''' | GaAs | N | 2 × 10¹⁸ | 0,02 |
| 3' | In₀.₂Ga₀.₈As | — | | 0,005 |
| 3" | GaAs | — | | 0,005 |
| 4''' | GaAs | P | 5 × 10¹⁷ | 0,02 |
| 4" | Al₀.₂Ga₀.₈As | P | 5 × 10¹⁷ | 0,04 |
| 4' | Al₀.₄Ga₀.₆As | P | 5 × 10¹⁷ | 0,15 |
| 4° | Al₀.₄Ga₀.₆As | P | 5 × 10¹⁷ | 1,2 |
| 5 | GaAs | P | 5 × 10¹⁷ | 0,01 |
| 6 | GaAs | P | 5 × 10¹⁸ | 0,5 |
| 10 | GaAs | P | 5 × 10¹⁸ | 0,5 |
| 13 | GaAs | N | 1 × 10¹⁸ | 1,7 |

The laser 100 according to this embodiment of the invention has a strip-shaped active region with a length $L_3$, here a length of approximately 600 µm, for which the power at which the derivative of the optical power (P) as a function of the current (I) through the pn junction changes is substantially a maximum. This means that the so-called P-I characteristic does not show a kink until at a very high optical power, i.e. a maximum optical power for the laser 100, in this case a power of approximately 85 mW, which renders the laser 100 according to this embodiment of the invention particularly suitable for many applications in which a linear P-I characteristic is desired up to a very high optical power.

Figure 9:
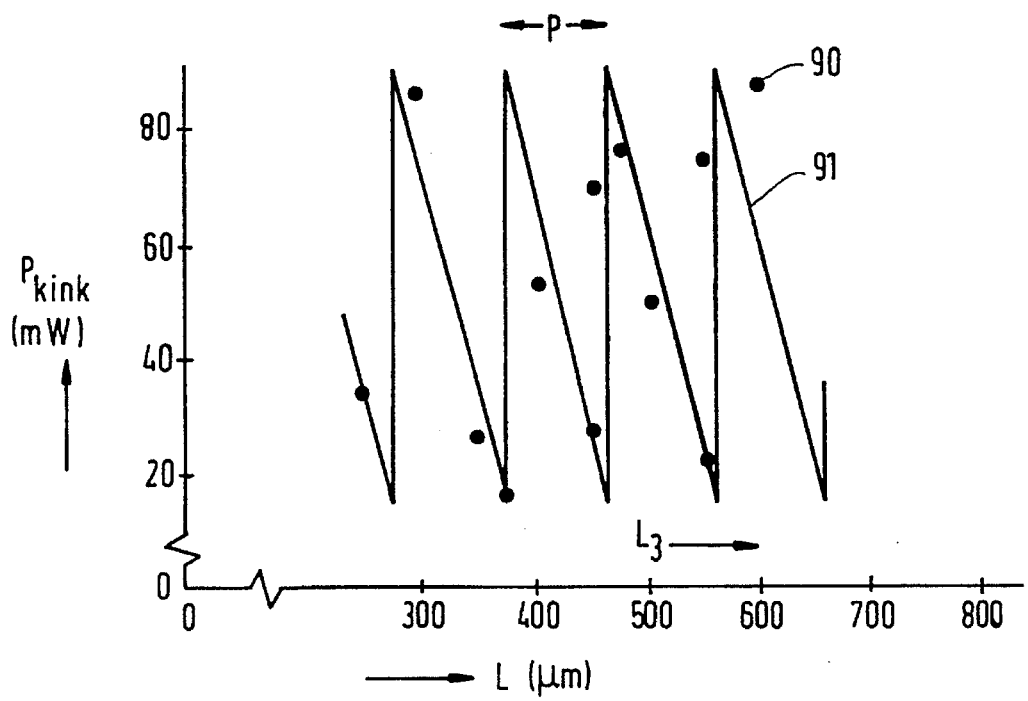
FIG. 9 shows the kink power ($P_{kink}$) of the laser of FIG. 8 as a function of the length (L) of the resonance cavity of the laser.

FIG. 9 shows the kink power $P_{kink}$ of the laser 100 of FIG. 8 as a function of the length (L) of the resonance cavity of the laser 100. The symbols 90 correspond to measurements carried out on actual lasers 100 on which the curve 91 was based. The results correspond to those of the preceding examples. The length $L_3$ of the laser 100 in this example is approximately 600 μm (see FIG. 9), whereby a kink power $P_{kink}$ of approximately 85 mW is achieved.

Figure 10:
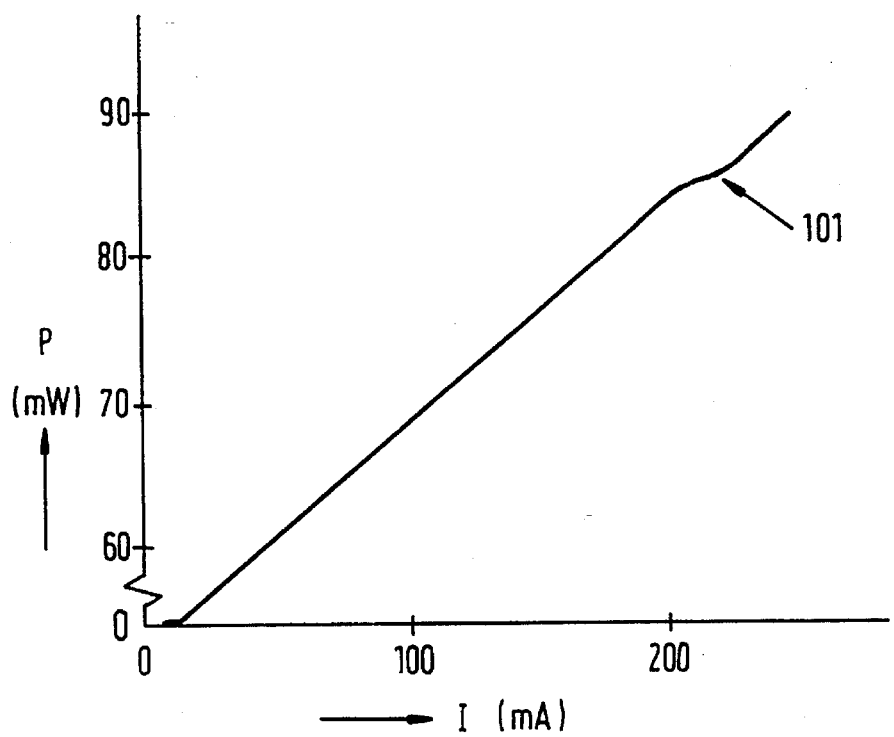
FIG. 10 shows the optical power (P) of the laser of FIG. 8 with a length $L_3$ as in FIG. 9 as a function of the current (I) through the laser.

FIG. 10 shows the optical power (P) of the laser of FIG. 8 with a resonance cavity with length $L_3$ (approximately 600 μm) as in FIG. 5 as a function of the current (I) through the laser. A kink is observed as late as at point 101. The laser 100 in this example has a starting current of approximately 15 mA, emits at a wavelength of approximately 980 nm, and is particularly suitable as a pumping laser for an optical glass fibre amplifier in an optical communication system.

The laser 100 according to this embodiment of the invention is manufactured in a manner which is substantially identical to the manufacture of the laser 100 of the first example. The differences follow from the differences in structure as given above.

The invention is not limited to the embodiments given, since many modifications and variations are possible to those skilled in the art within the scope of the invention. Thus different compositions of the chosen semiconductor materials, different layer thicknesses, and different dimensions from those mentioned in the examples may be used. It is also possible to replace the conductivity types all (simultaneously) with their opposites. Furthermore, other (index-guided) structures such as CSP (=Channelled Substrate Planar), SAS (=Self Aligned Structure), or VSIS (=V-grooved Substrate Inner Stripe) may be used. It is emphasized that the active region need not coincide with the resonance cavity in longitudinal direction, as was the case in the examples given. Thus, for example, an NAM (=Non-Absorbing Mirror) structure may be used. It is further noted that the invention also covers lasers with gratings such as DFB (=Distributed FeedBack) or DBR (=Distributed Bragg Reflector), provided the wavelength selectivity of the grating is sufficiently low. It should finally be pointed out that the methods of providing the semiconductor layers used in the embodiments may be different from the OMVPE technique. Thus it is alternatively possible to use MOMBE (=Metal Organic Molecular Beam Epitaxy), MBE (=Molecular Beam Epitaxy), VPE (=Vapour Phase Epitaxy), or LPE (=Liquid Phase Epitaxy).

We claim:

1. A semiconductor diode laser of the index-guided type, comprising a semiconductor body with a semiconductor substrate of a first conductivity type on which a semiconductor layer structure is disposed which comprises at least, in that order, a first cladding layer of the first conductivity type, an active layer, and a second cladding layer of a second conductivity type opposed to the first, and comprising a pn junction which can generate coherent electromagnetic radiation, given a sufficient current strength in the forward direction, in a strip-shaped active region situated within a resonance cavity which is limited by surfaces extending substantially perpendicular to the active region, the semiconductor layer structure being provided with means for forming a step in the effective refractive index on either side of the active region, and the first and the second cladding layer being provided with further means for forming an electrical connection, characterized in that the resonance cavity has at least a length for which the optical power at which the derivative of the optical power as a function of the current through the pn junction changes is a maximum.

2. A semiconductor diode laser as claimed in claim 1, characterized in that the length of the resonance cavity forms part of a set of lengths which lie at substantially equal distances from one another, for each of the lengths forming part of the set the optical power at which the derivative of the optical power as a function of the current through the pn junction changes being a maximum.

3. A semiconductor diode laser as claimed in claim 1, characterized in that the resonance cavity length lies between a first length for which the optical power at which the derivative of the optical power as a function of the current through the pn junction changes is a maximum, and a second length, greater than the first, for which said power is approximately 50% of its maximum value.

4. A semiconductor diode laser as claimed in claim 1, characterized in that the resonance cavity length lies between a first length for which the optical power at which the derivative of the optical power as a function of the current through the pn junction changes is a maximum, and a second length, greater than the first, for which said power is approximately 80% of its maximum value.

5. A semiconductor diode laser as claimed in claim 1, characterized in that the resonance cavity length lies between a first length for which the optical power at which the derivative of the optical power as a function of the current through the pn junction changes is a maximum and a second length which is approximately 20 μm greater than said first length.

6. A semiconductor diode laser as claimed in claim 2, characterized in that a length forming part of said set is equal to the smallest length for which the optical power at which the derivative of the optical power as a function of the current through the pn junction changes is a maximum, plus half the oscillation period between the fundamental and the first-order lateral modes of the electromagnetic radiation generated in the active region multiplied by an integer.

7. A semiconductor diode laser as claimed in claim 6, characterized in that the oscillation period is equal to $2\pi/(\beta_0-\beta_1)$ and to $\lambda/2*\Delta n_{01}$, in which $\beta_0$ and $\beta_1$ are the propagation constants of the fundamental and the first-order lateral modes, respectively, of the electromagnetic radiation generated in the active region, $\lambda$ is the wavelength of the electromagnetic radiation generated in the active region, and $\Delta n_{01}$ is the difference in effective refractive index for the fundamental and the first-order lateral modes of the electromagnetic radiation generated in the active region.

8. A semiconductor diode laser as claimed in claim 1, characterized in that the laser has a structure which is weakly index-guided and whose V parameter lies between approximately $\pi/2$ and approximately $\pi$, in which $V=(2*\pi*w/\lambda)*\sqrt{(n_2^2-n_1^2)}$, in which w is the width of the active region, $\lambda$ the wavelength of the laser emission, $n_2$ the effective refractive index at the area of the active region, and $n_1$ the effective refractive index on either side of the active region.

9. A semiconductor diode laser as claimed in claim 1, characterized in that said means comprise the semiconductor diode laser having a ridge waveguide structure.

10. A semiconductor diode laser as claimed in claim 9, characterized in that said means comprise the ridge waveguide structure being of the buried type and in that the layer by which the ridge waveguide is buried has a bandgap such that substantially no absorption of the generated electromagnetic radiation takes place.

11. A semiconductor diode laser as claimed in claim 1, characterized in that the surfaces bounding the resonance cavity are provided with a coating.

12. A semiconductor diode laser as in claim 1, wherein said laser is a pulsed mode laser.

13. A method of manufacturing a semiconductor diode laser of the index-guided type, comprising forming a semiconductor body by providing, on a semiconductor substrate of a first conductivity type, a semiconductor layer structure having at least, in that order, a first cladding layer of the first conductivity type, an active layer, and a second cladding layer of a second conductivity type opposed to the first, and forming a pn junction, a strip-shaped active region, and a surrounding resonance cavity bounded by surfaces which are substantially perpendicular to the active region, providing the semiconductor layer structure with means for forming a step in the effective refractive index on either side of the active region, providing first and second cladding layers with means for forming an electrical connection, and choosing a length for the resonance cavity for which the optical power at which the derivative of the optical power as a function of the current through the pn junction changes is a maximum.

* * * * *